United States Patent [19]
Peltier et al.

[11] Patent Number: 5,396,697
[45] Date of Patent: Mar. 14, 1995

[54] METHOD OF ASSEMBLING COMPOSITE BILLETS FOR MANUFACTURING MULTIFILAMENT SUPERCONDUCTING STRANDS

[75] Inventors: Francois Peltier, Evette-Salbert; Gia K. Hoang, Cravanche; Philippe Sulten, Evette-Salbert; Gérard Grunblatt, Errevet, all of France

[73] Assignee: Alsthom Intermagnetics SA, Belfort Cedex, France

[21] Appl. No.: 140,898

[22] Filed: Oct. 25, 1993

Related U.S. Application Data

[63] Continuation of Ser. No. 824,053, Jan. 23, 1992, abandoned.

[30] Foreign Application Priority Data

Jan. 24, 1991 [FR] France .......................... 91 00795

[51] Int. Cl.⁶ .......................................... H01L 39/24
[52] U.S. Cl. ..................................... 29/599; 29/468; 33/613; 53/474; 53/475
[58] Field of Search ................. 29/599, 464, 466, 468, 29/423; 33/502, 562, 613; 53/238, 244, 255, 236, 474, 475

[56] References Cited

U.S. PATENT DOCUMENTS 3,713,202  1/1973  Roberts et al. .................. 29/599 X
4,071,941  2/1978  Sweet ................................ 29/468

Primary Examiner—Joseph M. Gorski
Attorney, Agent, or Firm—Sughrue, Mion, Zinn, Macpeak & Seas; Richard C. Turner

[57] ABSTRACT

A method of assembling composite billets of circular section for manufacturing multifilament superconducting strands, in which a cylindrical body is initially filled with jig bars having at least one axis of symmetry of order n stacked inside the cylindrical body. As the jig bars are removed, one by one, each jig bar is replaced by a multi-part bar made up of unit rods stacked in ordered and compact manner to occupy minimum space. Each multi-part bar has the same section as the jig bar that it replaces. The jig bars are preferably rectangular, and more preferably square in section, and the multi-part bars that replace them are made up of unit rods that are rectangular and preferably square in section. The method facilitates and speed up assembly.

5 Claims, 2 Drawing Sheets

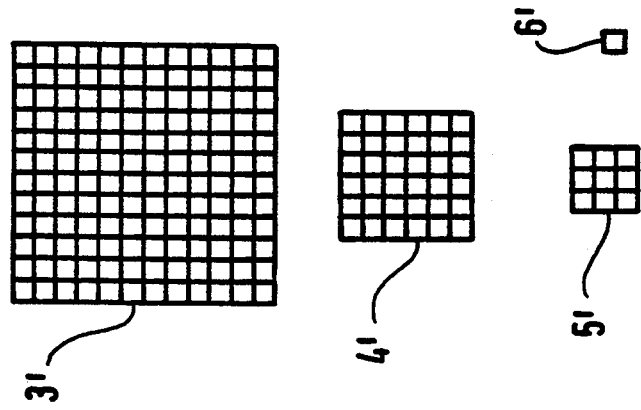
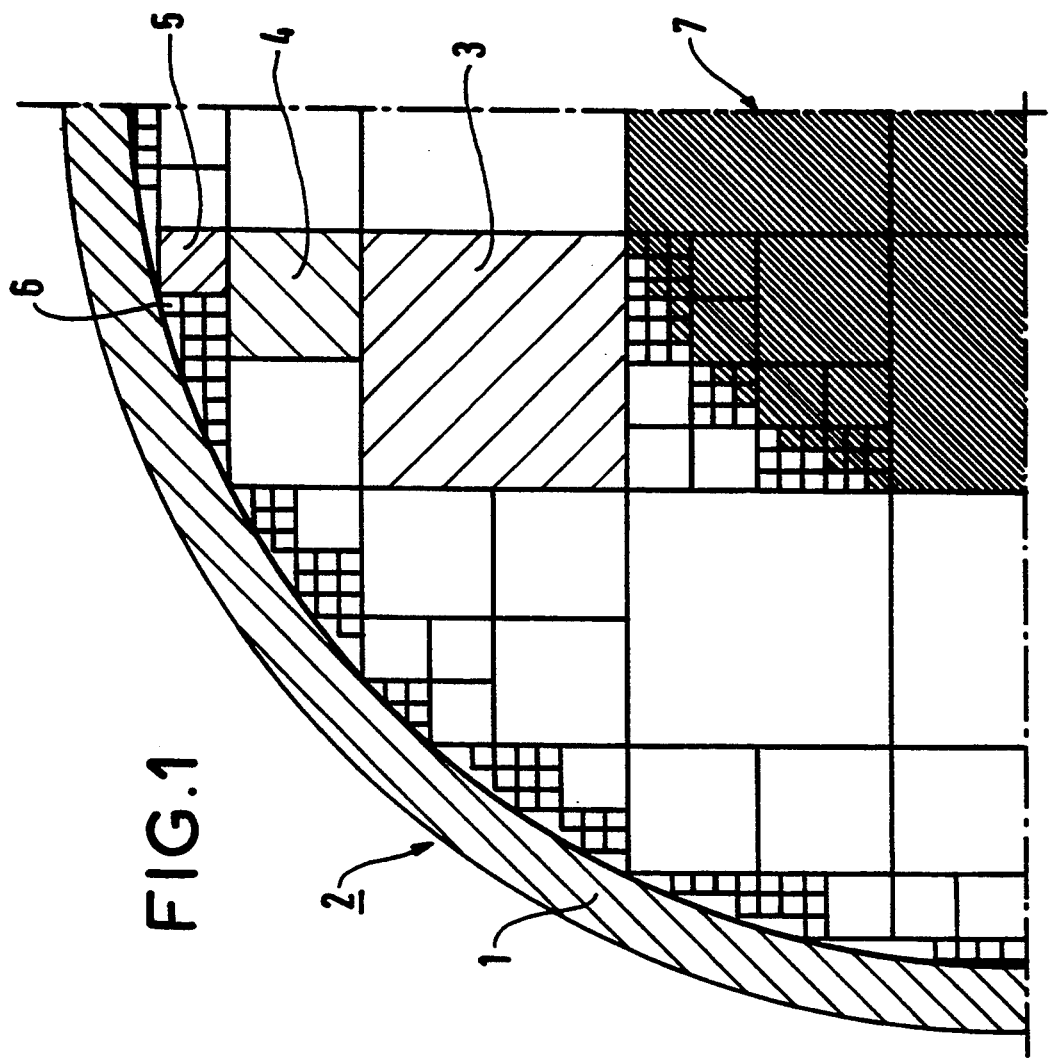

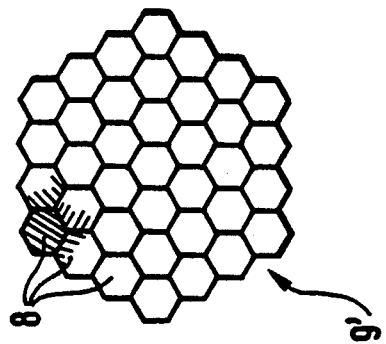
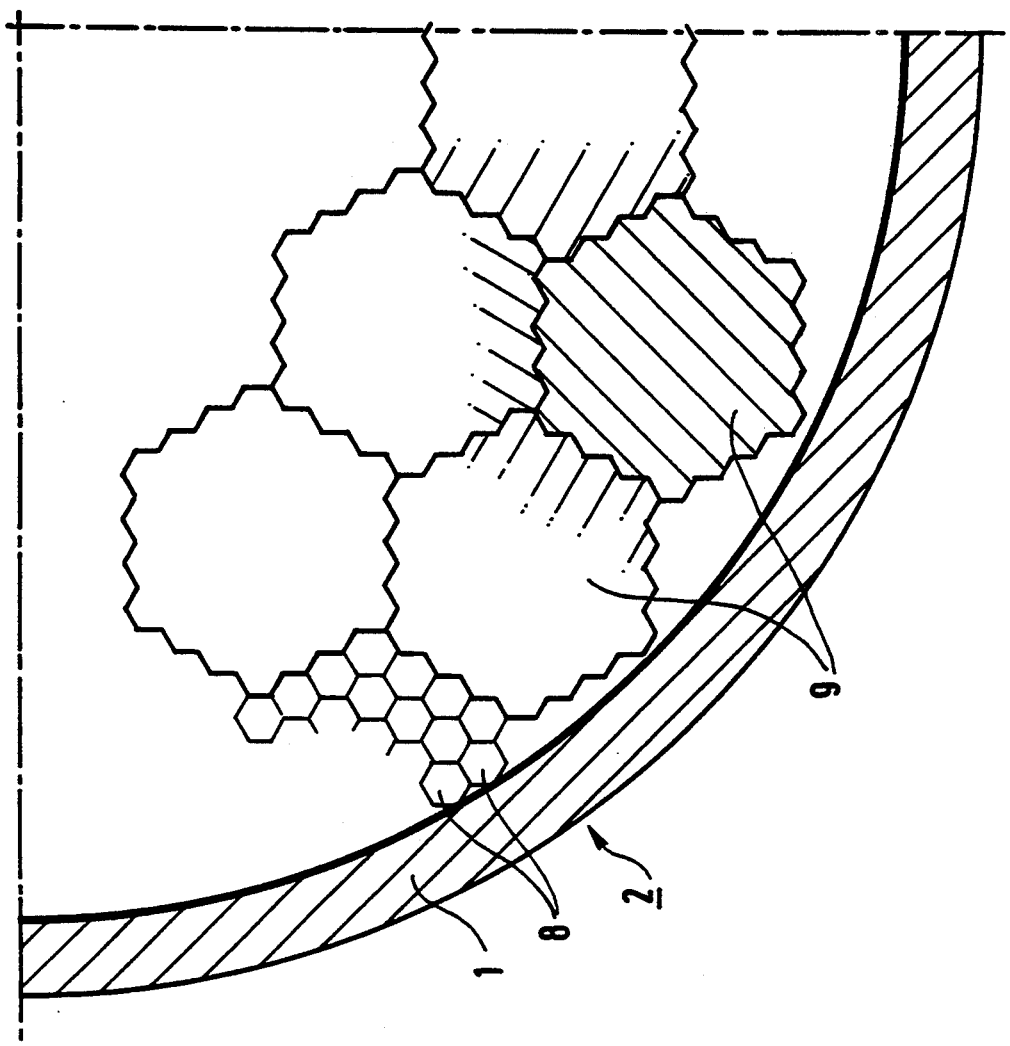

METHOD OF ASSEMBLING COMPOSITE BILLETS FOR MANUFACTURING MULTIFILAMENT SUPERCONDUCTING STRANDS

This is a continuation of application Ser. No. 07/824,053 filed Jan. 23, 1992, and now abandoned. The present invention relates to a method of assembling composite billets for manufacturing multifilament superconducting strands, and in particular superconducting wires based on metal alloys (NbTi, Nb$_3$Sn, . . . ), and any other composite having fiber reinforcement.

BACKGROUND OF THE INVENTION

The conventional method of manufacturing superconducting wires includes one or more steps of hot extruding composite billets followed by drawing and wire drawing down to the final diameter. These billets are generally constituted by a cylindrical body which, depending on circumstances, contains several hundred to several tens of thousands of components which are in the form of rods and which may themselves be composite.

One possible way of reducing the manufacturing costs would be to reduce the number of extrusion steps, and that would simultaneously improve the performance of the superconducting strand. Such a reduction in the number of steps would be possible if it were possible to manufacture billets including a large number of rods. However, there are practical difficulties in making up such billets, and these difficulties increase with the number of components:

- with rods of hexagonal section as are normally used to ensure good packing, the time required for stacking the rods is long even if they are properly smooth and not twisted; the number of hexagonal rods that can be assembled together properly without special tooling remains very low; and
- the use of rods that are circular in section reduces stacking time but leads to a poor packing factor which is due to the numerous cross-overs between the rods and to the existence of empty spaces between them.

SUMMARY OF THE INVENTION

The method of the invention comprises first stacking jig bars having at least one axis of symmetry of order n (where n is a positive integer greater than or equal to two) inside the cylindrical body, after which the jig bars are removed one by one. Each jig bar is replaced as it is removed by a correspondingly sized multi-part bar made up of unit rods stacked in ordered and compact manner to occupy minimum space, each multi-part bar having the same section as the jig bar that it replaces. After one jig bar is removed it is replaced by a multi-part bar, then after a second jig bar is removed, it is replaced by a second multi-part bar, etc.

Assembly time is considerably shorter than in the conventional method and the resulting billets are very compact.

In a preferred implementation of the invention making assembly very fast and very compact, the jig bars are rectangular in section and each multi-part bar having the same section as the jig bar it replaces is constituted by a stack of unit rods that are rectangular in section, or are preferably square in section.

The rectangular or square sections of the bars are preferably of different sizes in order to further increase assembly speed.

BRIEF DESCRIPTION OF THE DRAWINGS

Embodiments of the invention are described by way of example with reference to the accompanying drawings, in which:

FIG. 1 shows a billet that is being assembled.

FIG. 2 shows the multi-part bars of rods that are used for making the assembly of FIG. 1.

FIG. 3 shows a variant billet while it is being assembled.

FIG. 4 shows a multi-part bar for use in the assembly of FIG. 3.

DETAILED DESCRIPTION

In accordance with the method of the invention, the body 1 of the billet 2 which is a horizontally-disposed cylinder of copper or of cupro-nickel is filled with jig bars 3, 4, and 5 of square section. The sections of the jig bars 3, 4, and 5 are different. The largest-section jig bar 3 has a section that is 144 times (12×12) the section of a square-section unit rod 6.

The section of the medium jig bar 4 is equal to 6×6 times the section of a unit rod 6 and the section of the small jig bar 5 is equal to 3×3 times the section of a unit rod 6.

The remaining spaces (in particular along the inside surface of the body 1, see FIG. 1) are then filled with unit rods 6.

The jig bars 3, 4, and 5 are then withdrawn one-by-one, and after each bar is withdrawn, that jig bar is replaced by a multi-part bar having the same section.

The multi-part bar 3' replacing the jig bar 3 is made by stacking 144 unit rods 6, the multi-part bar 4' is made by stacking 36 unit rods, and the multi-part bar 5' is made by stacking 9 rods (see FIG. 2).

Thus, in the example described, the billet is to have 1092 copper rods in its center surrounded by 3876 composite rods, with each rod having a section of 2.2 mm×2.2 mm.

This is done by placing a large jig bar 3 in the center and surrounding it with four large jig bars 3, and with smaller jig bars 4 and 5 for filling up the intermediate spaces between the four large jig bars 3 so as to form an assembly 7 in the center having a section that approximates a circle.

The jig bars in this assembly 7 are replaced one by one by corresponding multi-part bars made up of unit rods made of copper. Round the edges of the assembly 7, some of the jig bars are replaced by multi-part bars 5'' that are variegated, having both copper rods and composite rods. In any event, the square type stack of the invention makes it possible to maintain rods 6 that are already in place in their final positions even while performing a substitution operation.

Although the example described makes use of rods 6, of jig bars 3, 4, and 5, and of multi-part bars 3', 4', and 5' that are all square in section, it is possible, even though that makes manufacture a little longer, to make use of rods and/or jig bars and multi-part bars some of which are rectangular in section, but not square, while others are square in section, or all of which are rectangular in section, but not square.

More generally, the method of the invention is applicable to any billet made up of polygonal section rods providing the jig bars used have the same polygonal section as the multi-part bars obtained by ordered and compact stacking of the unit rods.

This stacking must be done in such a manner that the section of a multi-part bar occupies minimum space and has a longitudinal axis of symmetry for order n rotation, where n is a positive integer equal to or greater than two. The example shown in FIGS. 3 and 4 corresponds to the case where hexagonal section rods 8 are used with jig bars 9 having the same shape as multi-part bars 9' comprising 37 unit rods 8 obtained by hexagonal stacking.

We claim:

1. A method of assembling composite billets of circular section for manufacturing multi filament superconducting strands comprising the steps of:

initially filling a metallic cylindrical body with jig bars having at least one axis of symmetry of order n by stacking said jig bars inside the cylindrical body, removing the jig bars one by one and replacing each jig bar after removal of each jig bar and prior to removal of another jig bar with a multi-part bar made up of unit rods of a metal or metal alloy chosen from metals or metal alloys used in multifilament superconducting strand manufacturing, and stacked in ordered and compact manner to occupy minimum space, with each multi-part bar having the same cross-section as the jig bar that said multi-part bar replaces, all of the jig bars being eventually replaced.

2. The method according to claim 1, wherein the jig bars are rectangular in section and wherein each multi-part bar having the same cross-section as the jig bar being replaced is constituted by a stack of unit rods that are rectangular in section.

3. The method according to claim 2, wherein the jig bars are square in cross-section and the multi-part bars that replace the jig bars are also square in cross section.

4. The method according to claim 2, wherein various jig bars have different sized cross-sections relative to each other.

5. A method of assembling composite billets of circular section for manufacturing multifilament superconducting strands comprising the steps of:

initially filling a cylindrical body made of a material from the group consisting of copper and cupronickel with jig bars having at least one axis of symmetry of order n by stacking said jig bars inside the cylindrical body, removing the jig bars one by one and replacing each jig bar after removal of each jig bar and prior to removal of another jig bar with a multi-part bar made up of unit rods of metal alloys from the group consisting of NbTi and Nb$_3$Sn and stacked in ordered and compact manner to occupy minimum space, with each multi-part bar having the same cross-section as the jig bar that said multi-part bar replaces, all of the jig bars being eventually replaced.

* * * * *